United States Patent [19]

Kondoh et al.

[11] Patent Number: 5,684,750
[45] Date of Patent: Nov. 4, 1997

[54] SEMICONDUCTOR MEMORY DEVICE WITH A SENSE AMPLIFIER INCLUDING TWO TYPES OF AMPLIFIERS

[75] Inventors: Setsu Kondoh; Shigeki Ohbayashi, both of Hyogo, Japan

[73] Assignee: Mitsubishi Denki Kabushiki Kaisha, Tokyo, Japan

[21] Appl. No.: 623,801

[22] Filed: Mar. 29, 1996

[51] Int. Cl.[6] .................................................. G11C 7/02
[52] U.S. Cl. ........................ 365/205; 365/207; 365/208
[58] Field of Search .................................. 365/205, 207, 365/208, 189.05, 230.03, 230.08, 219, 189.12

[56] References Cited

U.S. PATENT DOCUMENTS

| | | | |
|---|---|---|---|
| 4,811,295 | 3/1989 | Shinoda | 365/189.05 |
| 5,367,486 | 11/1994 | Mori et al. | 365/189.05 |
| 5,377,150 | 12/1994 | McClure | 365/207 |
| 5,519,661 | 5/1996 | Miura | 365/208 |

FOREIGN PATENT DOCUMENTS

| | | |
|---|---|---|
| 61-271690 | 12/1986 | Japan . |
| 2-301097 | 12/1990 | Japan . |
| 6-90161 | 3/1994 | Japan . |

*Primary Examiner*—David C. Nelms
*Assistant Examiner*—Vu A. Le
*Attorney, Agent, or Firm*—Lowe, Price, LeBlanc & Becker

[57] ABSTRACT

A double current mirror type differential amplifier that can operate at high speed is only used for a predetermined time period to amplify speedily a potential difference according to data read out from a memory cell. When the potential difference amplified by the double current mirror type differential amplifier becomes greater than an offset voltage of a latch type amplifier, the potential difference is further amplified only with the latch type amplifier of low power consumption. By providing a double current mirror type differential amplifier that can operate at high speed but has great power consumption and a latch type amplifier that has low power consumption but cannot operate at high speed, the disadvantage of the double current mirror type differential amplifier is compensated for by the latch type amplifier, and the disadvantage of the latch type amplifier is compensated for by the advantage of the double current mirror type differential amplifier. Thus, high speed and low power consumption can be realized with an SSRAM (Synchronous Type Static Random Access Memory) including a double current mirror type differential amplifier and a latch type amplifier.

17 Claims, 7 Drawing Sheets

SEMICONDUCTOR MEMORY DEVICE WITH A SENSE AMPLIFIER INCLUDING TWO TYPES OF AMPLIFIERS

BACKGROUND OF THE INVENTION

1. Field of the Invention

The present invention relates to synchronous static random access memories (referred to as SSRAM hereinafter), and more particularly, to an SSRAM including a sense amplifier that can operate at high speed and low power consumption.

2. Description of the Background Art

In recent years, SRAMs (Static Random Access Memory) have been increased in speed and reduced in power consumption.

A first conventional SRAM will be described hereinafter.

In a first conventional SRAM, the potential difference between a pair of data input/output lines (line IO line/IO) according to data read out from a memory cell is amplified by a current mirror type differential amplifier. When speed is to be increased, amplification of the potential difference of the data input/output line pair is effected using a double current mirror type differential amplifier formed of two current mirror type differential amplifiers.

A second conventional SRAM will be described hereinafter.

In a second conventional SRAM, the potential difference between a pair of data input/output lines is amplified by a latch type amplifier according to data from a memory cell. In this latch type amplifier, there is no current path between a node including a power supply potential Vcc and a node including a ground potential GND during the operation thereof except at the initial state. Reduction in power consumption of an SRAM is effected by usage of a latch type amplifier.

In the first conventional SRAM, it is difficult to reduce power consumption since a double current mirror type differential amplifier (sense amplifier) of great consumption power is operated during the rise of a word line.

A latch type amplifier used in the second conventional SRAM cannot be restored as long as the operation is not ceased when erroneous data is once amplified. The offset potential must be carefully observed in order to prevent such an erroneous operation. Thus, there was a problem that usage thereof is difficult. Here, the offset voltage of a latch type amplifier refers to the potential difference between data input/output lines that prevents erroneous operation of a latch type amplifier.

Furthermore, in the second conventional SRAM, it is necessary to wait until the potential difference between the data input/output line pair becomes greater than the offset voltage of the latch type amplifier. Therefore, there was a problem that it is difficult to increase the speed.

SUMMARY OF THE INVENTION

In view of the foregoing, an object of the present invention is to provide a semiconductor memory device that can operate at high speed and at low power consumption.

The semiconductor memory device according to the present invention includes a memory cell array with a plurality of memory cells. The semiconductor memory device of the present invention includes a sense amplifier for amplifying data read out from a memory cell.

The sense amplifier includes a level shift circuit, and first and second amplifiers. The level shift circuit shifts the levels of the potentials of a first pair of data output lines to which data from a memory cell is read out to lower levels.

The first amplifier amplifies the potential difference of a second pair of data output lines to which the level-shifted potentials are applied for a predetermined time period. This potential difference is based on the data of a memory cell.

The second amplifier further amplifies the potential difference amplified by the first amplifier. The first amplifier operates more speedily than the second amplifier. The second amplifier is a latch type amplifier.

The semiconductor memory device according to the present invention speedily carries out amplification of the potential difference with the first amplifier until the potential difference becomes greater than the offset voltage (a predetermined period) of the latch type second amplifier. When the potential difference becomes higher than the offset voltage of the latch type second amplifier, amplification of the potential difference is effected only by the latch type second amplifier of low power consumption.

In the semiconductor memory device of the present invention, the first amplifier is operated for a predetermined time period to compensate for the disadvantage of the first amplifier (great power consumption) with the advantage of the second amplifier (low power consumption). Furthermore, the disadvantage of the second amplifier (high speed operation cannot be carried out since the rise of the input potential difference to a level greater than the offset voltage is time consuming) is compensated for by the advantage of the first amplifier (the time period of the potential difference becoming greater than the offset voltage of the second amplifier is short due to its high speed operation). The advantage of the first amplifier (high speed operation) and the advantage of the second amplifier (low power consumption) are applied effectively. Thus, high speed operation and low power consumption can be realized by the semiconductor device of the present invention.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An SSRAM will be described hereinafter with reference to the drawings as a semiconductor memory device of the present invention.

Figure 1:
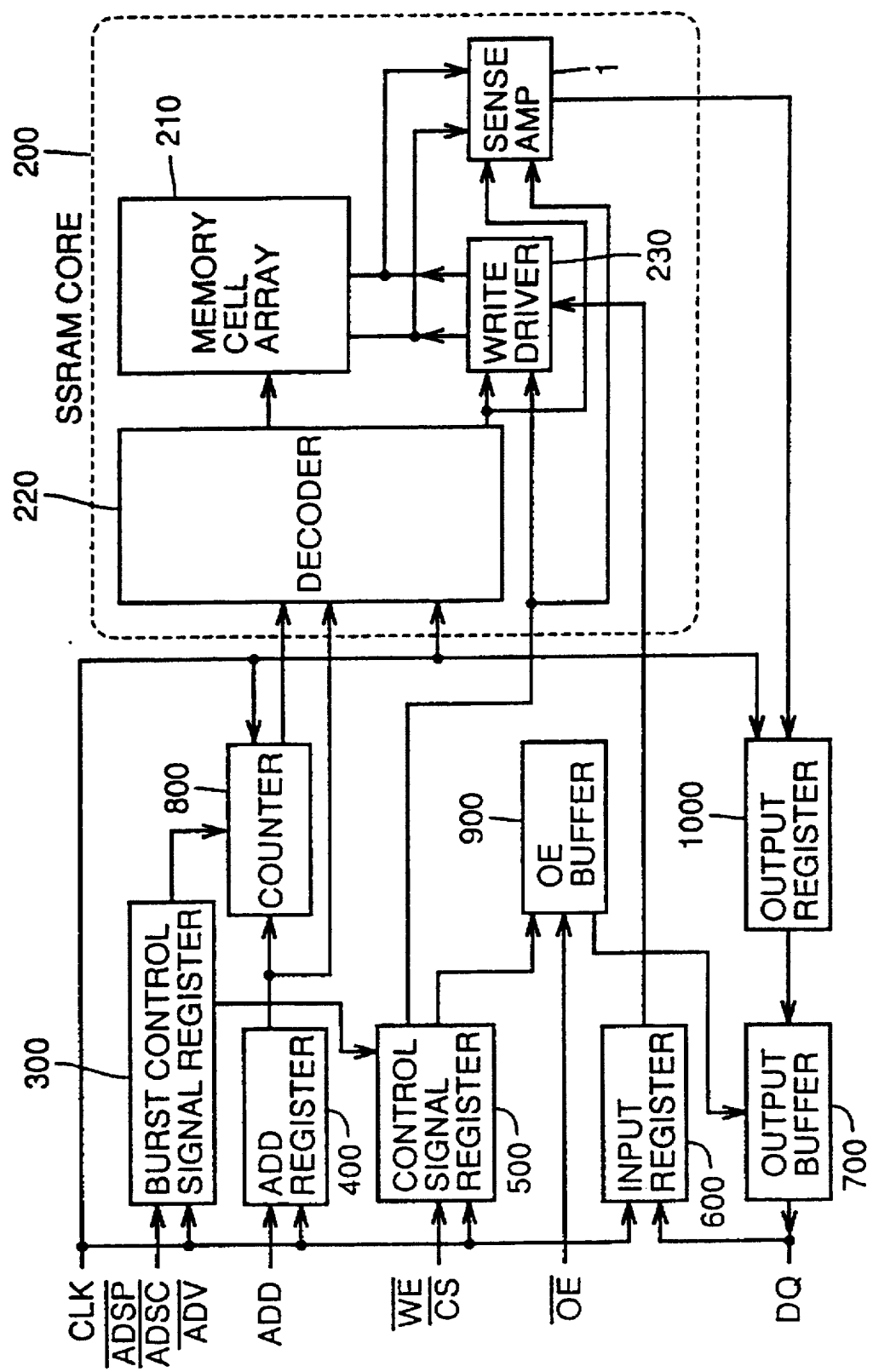
FIG. 1 is a block diagram schematically showing an SSRAM according to an embodiment of the present invention.

Referring to FIG. 1, an SSRAM according to an embodiment of the present invention includes an SSRAM core 200, a burst control signal register 300, an ADD register 400, a control signal register 500, an input register 600, an output buffer 700, a counter 800, an OE buffer 900, and an output register 1000.

SSRAM core 200 includes a memory cell array 210, a decoder 220, a write driver 230, and a sense amplifier 1.

Burst control signal register 300 receives an address status input signal /ADSP from a processor, an address status input signal /ADSC from a controller, and an address advance input signal /ADV. Burst control signal register 300 generates a signal for controlling the burst operation according to signals /ADSP, /ADSC and /ADV. A burst operation refers to the operation of generating the next address from counter 800 when the head address of the burst mode is entered into a memory (SSRAM). A burst mode is a high speed transfer mode in which an MPU (microprocessor unit) accesses a memory (SSRAM).

ADD register 400 receives an address signal ADD. Counter 800 generates continuous internal address signals according to an address signal from address register 400. Counter 800 operates only during a burst operation to generate an internal address signal continuous to the address of a previous cycle. Decoder 220 selects a memory cell in memory cell array 210 according to an external address or an internal address signal from counter 800.

Control signal register 500 receives a write enable signal /WE and a chip select signal /CS to generate a signal for controlling a writing/reading operation. Write driver 230 writes data DQ entered via input register 600 to a memory cell (in memory cell array 210). Write driver 230 is controlled by a write/read control signal that is generated from control signal register 500 according to write enable signal /WE and chip select signal /CS and that is in synchronization with clock signal CLK to write data from input register 600 according to a memory cell address generated from decoder 220. Sense amplifier 1 amplifies data from a memory cell in memory cell array 210. The data amplified by sense amplifier 1 is output as data DQ via output register 1000 and output buffer 700. Sense amplifier 1 is controlled by a write/read control signal from control signal register 500 in synchronization with clock signal CLK to amplify data read out from a memory cell of an address generated from decoder 220.

OE buffer 900 receives output enable signal /OE and a signal from control signal register 500 to control output buffer 700 during a data readout operation.

Burst control signal register 300, ADD register 400, control signal register 500, input register 600, counter 800, decoder 220 and output register 1000 operate in synchronization with an externally applied clock signal CLK.

The feature of the present invention lies in sense amplifier 1. Description will be provided hereinafter on the basis of sense amplifier 1.

Figure 2:
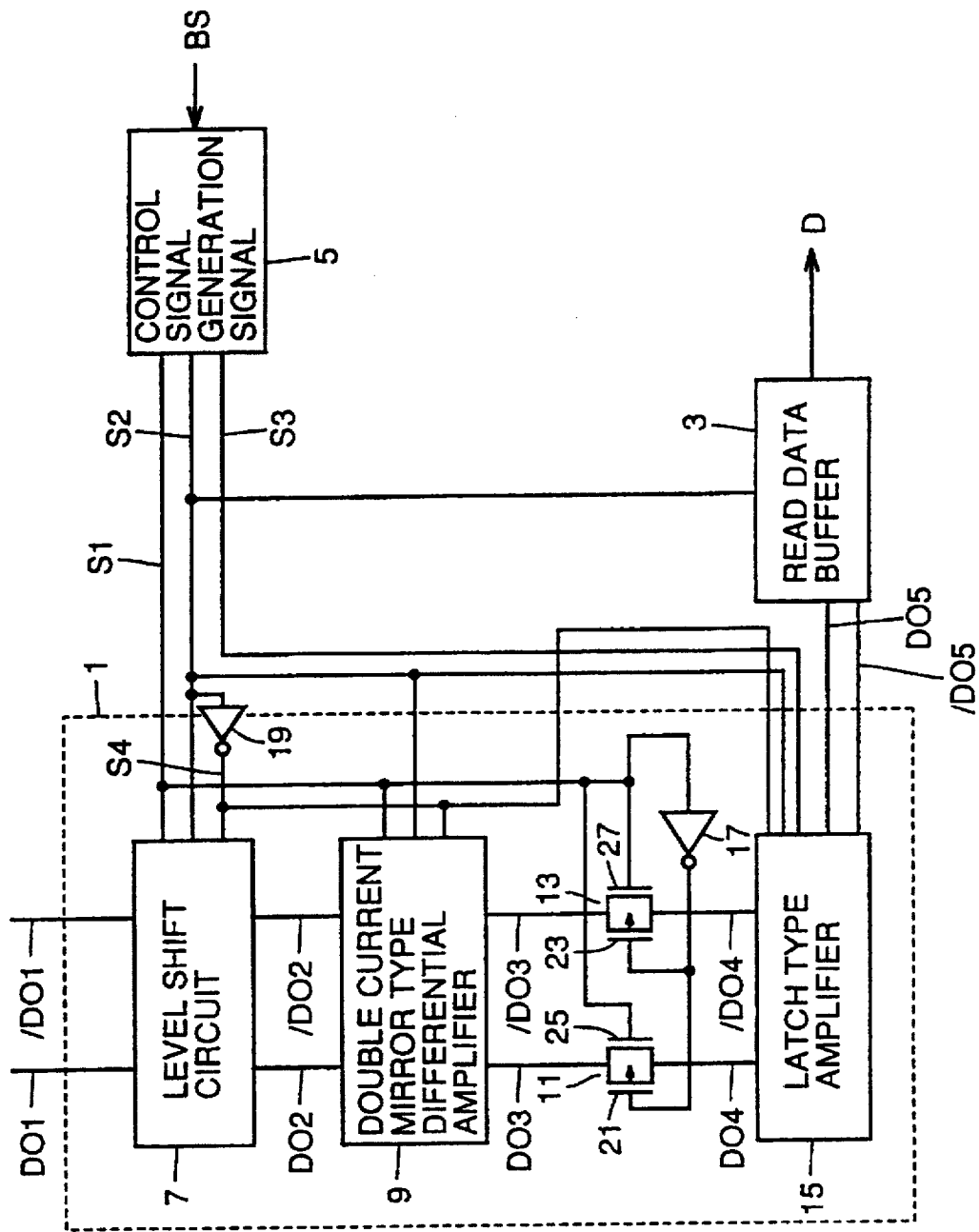
FIG. 2 is a block diagram schematically showing the characteristic portions of an SSRAM according to an embodiment of the present invention.

It is to be noted that sense amplifier 1 shown in FIG. 1 is contemplated to include sense amplifier 1, read data buffer 3, and control signal generation circuit 5 of FIG. 2 altogether.

Referring to FIG. 2, the characteristic portion of the SRAM according to an embodiment of the present invention includes a sense amplifier 1, a read data buffer 3, and a control signal generation circuit 5. Sense amplifier 1 includes a level shift circuit 7, a double current mirror type differential amplifier 9, transfer gates 11 and 13, a latch type amplifier 15, and inverters 17 and 19. Transfer gate 11 includes a PMOS transistor 21 and an NMOS transistor 25. Transfer gate 13 includes a PMOS transistor 23 and an NMOS transistor 27.

Data output lines DO1 and /DO1 are generally referred to as data input/output lines (line IO and line /IO). These lines are designated "data output lines DO1 and /DO1" in the present specification since sense amplifier 1 is associated with data output.

Control signal generation circuit 5 generates control signals S1, S2 and S3 according to block select signal BS. Block select signal BS serves to determinate which block is to be activated when a memory cell array including a plurality of memory cells is divided into a plurality of blocks. Block select signal BS is based on a write/read control signal and a signal according to a decoded address signal. More specifically, block select signal BS is generated in synchronization with an external clock signal.

Level shift circuit 7 receives control signals S1, S2, and S4. Level shift circuit 7 is connected to data output lines DO1 and /DO1.

Double current mirror type differential amplifier 9 receives control signals S1, S2, and S4. Level shift circuit 7 and double current mirror type differential amplifier 9 are connected via data output lines DO2 and /DO2.

Transfer gates 11 and 13 receive a control signal S1 and a signal by inverter 17 which is an inverted version of control signal S1. Double current mirror type differential amplifier 9 and transfer gates 11 and 13 are connected by data output lines DO3 and /DO3.

Latch type amplifier 15 receives control signals S2, S3, and S4. Transfer gates 11 and 13 and latch type amplifier 15 are connected by data output lines DO4 and /DO4.

Read data buffer 3 receives control signal S2. Latch type amplifier 15 and read data buffer 3 are connected by data output lines DO5 and /DO5. Read data buffer 3 provides data D to a data bus according to signals from data output lines DO5 and /DO5.

The operation will be described hereinafter.

When a word line is activated, data from a memory cell is read out to data output lines DO1 and /DO1. In this case, the potentials of data output lines DO1 and /DO1 have a level in the vicinity of power supply potential Vcc.

Level shift circuit 7 pulls down the potentials of data output lines DO1 and /DO1 in the vicinity of the level of power supply potential Vcc to a level of an intermediate potential of power supply potential Vcc. The potential is set to a level at which double current mirror type differential amplifier 9 of the next stage is operable by this level shifting.

As a result of the level shifting of level shift circuit 7, the potentials of data output lines DO2 and /DO2 attain the level of intermediate potential. In this case, the potential of data output line DO2 is equalized with that of data output line /DO2. Therefore, double current mirror type differential amplifier 9 has not yet initiated a sense operation.

Double current mirror type differential amplifier 9 initiates a sense operation when equalization of the potential of data output line DO2 and the potential of data output line /DO2 is canceled. Then, double current mirror type differential amplifier 9 amplifies the potential difference between the pair of data output lines DO2 and /DO2. The amplified potential difference appears on data output lines DO3 and /DO3.

The operation of double current mirror type differential amplifier 9 is ceased when the potential difference between the pair of data output lines DO3 and /DO3 is sufficient (greater than the offset voltage of latch type amplifier 15). This double current mirror type differential amplifier 9 operates at high speed. It is to be noted that double current mirror type differential amplifier 9 consumes a great amount of power.

When the operation of double current mirror type differential amplifier 9 ceases, transfer gates 11 and 13 cut off the connection between data input/output lines DO3 and /DO3 and data output lines DO4 and /DO4. This prevents the flow of current to double current mirror type differential amplifier 9 even when a current path is established between data output line DO3 and data output line /DO3 via double current mirror type differential amplifier 9.

Latch type amplifier 15 initiates its operation simultaneous to the cessation of the operation of double current mirror type differential amplifier 9 (when the potential difference of the pair of data output lines DO4 and /DO4 becomes greater than the offset voltage of latch type amplifier 15). Then, the potential difference of the pair of data output lines DO4 and /DO4 is further amplified. The amplified potential difference appears on the pair of data output lines DO5 and /DO5. It is to be noted that latch type amplifier 15 of low power consumption requires time for initiating its operation until the input potential difference becomes greater than the offset voltage. Therefore, high speed operation cannot be achieved just by a latch type amplifier.

In an SSRAM according to the present embodiment, the potential difference is amplified at high speed to a level greater than the offset voltage of latch type amplifier 15 using double current mirror type differential amplifier 9. As a result, the disadvantage of the usage of latch type amplifier 15 (high speed operation is not allowed since operation cannot be initiated until the input potential difference becomes greater than the offset voltage) is eliminated.

When the input potential difference in latch type amplifier 15 becomes greater than the offset voltage of latch type amplifier 15, the operation of double current mirror type differential amplifier 9 of great power consumption is ceased to carry out an amplify operation just by latch type amplifier 15 of low power consumption. As a result, the disadvantage of carrying out amplification only with double current mirror type differential amplifier 9 (great power consumption) can be eliminated.

In the SSRAM of the present embodiment, the disadvantage of double current mirror type differential amplifier 9 is compensated for by the advantage of latch type amplifier 15, whereas the disadvantage of latch type amplifier 15 is compensated for by the advantage of double current mirror type differential amplifier 9. Thus, the advantages of double current mirror type differential amplifier 9 and latch type amplifier 15 are effectively applied.

The SSRAM according to an embodiment of the present invention can realize high speed operation and low power consumption.

Figure 3:
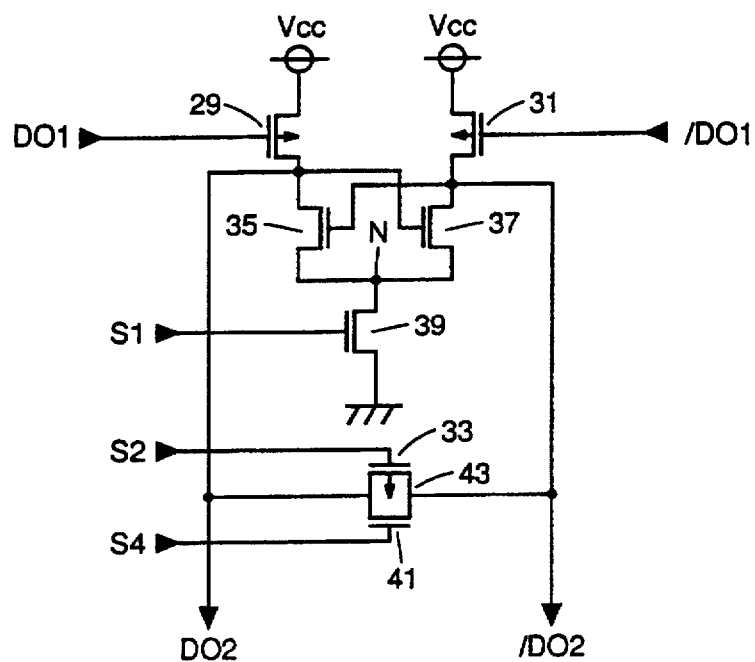
FIG. 3 is a circuit diagram showing in detail a level shift circuit of FIG. 2.

FIG. 3 is a circuit diagram showing in detail level shift circuit 7 of FIG. 2. Components corresponding to those of FIG. 2 have the same reference characters allotted, and are not otherwise described herein.

Referring to FIG. 3, level shift circuit 7 includes PMOS transistors 29 and 31, NMOS transistors 35, 37 and 39, and an equalize circuit 43. Equalize circuit 43 includes a PMOS transistor 33 and an NMOS transistor 41.

PMOS transistor 29 and NMOS transistor 35 are connected in series between the node including power supply potential Vcc and a node N. PMOS transistor 29 has its gate connected to data output line /DO1 and its drain connected to data output line DO2.

PMOS transistor 31 and NMOS transistor 37 are connected in series between a node including power supply potential Vcc and node N. PMOS transistor 31 has its gate connected to data output line /DO1 and its drain connected to data output line /DO2.

NMOS transistor 35 has its gate connected to the drain of PMOS transistor 31. NMOS transistor 37 has its gate connected to the drain of PMOS transistor 29.

NMOS transistor 39 is connected between node N and a node including ground potential. The gate of NMOS transistor 39 receives control signal S1.

PMOS transistor 33 and NMOS transistor 41 has one source/drain connected to data output line DO2. PMOS transistor 33 and NMOS transistor 41 have the other source/drain connected to data output line /DO2. The gate of PMOS transistor 33 receives control signal S2. The gate of NMOS transistor 41 receives control signal S4.

Level shift circuit 7 initiates its operation when control signal S1 of an H level (logical high) is applied to NMOS transistor 39. The potential of a level in the vicinity of power supply potential Vcc applied to PMOS transistor 29 is shifted down to the level of approximately the intermediate potential of power supply potential Vcc. The potential of data output line DO1 having its level shifted to the intermediate potential level is provided to data output line DO2. The potential of a level in the vicinity of power supply potential Vcc applied to PMOS transistor 31 is also shifted in level to be output to data output line /DO2.

Equalize circuit 43 equalizes the potential of data output line DO2 with the potential of data output line /DO2 when control signal S2 of an L level (logical low) and control signal S4 of an H level are applied. Since the potential of data output line DO2 is equal to the potential of data output line /DO2 during equalization, double current mirror type differential amplifier 9 of FIG. 2 does not carry out a sense operation. NMOS transistors 35 and 37 are cross-coupled to improve the gain while shifting the potential level.

Figure 4:
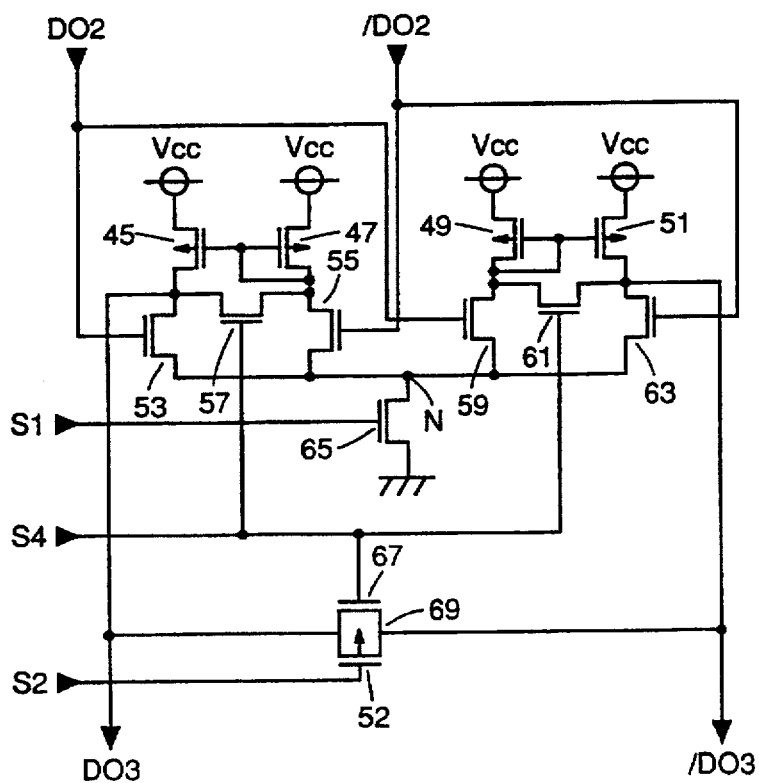
FIG. 4 is a circuit diagram showing in detail a double current mirror type differential amplifier of FIG. 2.

FIG. 4 is a circuit diagram showing in detail double current mirror type differential amplifier 9 of FIG. 2. Components corresponding to those in FIG. 2 have the same reference characters allotted, and their description will not otherwise be repeated.

Referring to FIG. 4, double current mirror type differential amplifier 9 includes PMOS transistors 45, 47, 49, 51, NMOS transistors 53, 55, 57, 59, 61, 63, 65, and an equalize circuit 69. Equalize circuit 69 includes an NMOS transistor 67 and a PMOS transistor 52.

PMOS transistors 45 and 47 and NMOS transistors 53, 55, and 65 form one current mirror type differential amplifier. PMOS transistors 49 and 51 and NMOS transistors 59, 63 and 65 form one current mirror type differential amplifier.

PMOS transistor 45 and NMOS transistor 53, PMOS transistor 47 and NMOS transistor 55, PMOS transistor 49 and NMOS transistor 59, and PMOS transistor 51 and NMOS transistor 63 are respectively connected in series between a node including power supply potential Vcc and node N.

PMOS transistor 45 and PMOS transistor 47 form a current mirror circuit. NMOS transistor 57 is connected between the drain of PMOS transistor 45 and the drain of PMOS transistor 47. The drain of PMOS transistor 45 is connected to data output line DO3.

PMOS transistor 49 and PMOS transistor 51 form a current mirror circuit. NMOS transistor 61 is connected between the drain of PMOS transistor 49 and the drain of PMOS transistor 51. The drain of PMOS transistor 51 is connected to data output line /DO3.

The gates of NMOS transistors 53 and 59 are connected to data output line DO2. The gates of NMOS transistors 55 and 63 are connected to data output line /DO2. Control signal S4 is applied to the gates of NMOS transistors 57 and 61. Control signal S1 is applied to the gate of NMOS transistor 65 connected between node N and the node including ground potential.

NMOS transistor 67 and PMOS transistor 52 have one source/drain connected to data output line DO3 and the other source/drain connected to data output line D03. Control signal S4 is applied to the gate of NMOS transistor 67. Control signal S2 is applied to the gate of PMOS transistor 52. The drains of PMOS transistor 45 and PMOS transistor 51 are the output nodes of double current mirror type differential amplifier 9.

Double current mirror type differential amplifier 9 attains a state in which its operation can be initiated when control signal S1 of an H level is applied to the gate of NMOS transistor 65. Double current mirror type differential amplifier 9 initiates its operation when equalization of the potentials between data output lines D02 and /D02 is canceled to generate potential difference therebetween. The potential difference between data output lines DO2 and /DO2 is amplified speedily to be provided to the pair of data output lines DO3 and /DO3.

When control signal S4 of an H level is applied to the gate of NMOS transistor 57, the potential of the drain of PMOS transistor 45 is equalized with that of the drain of PMOS transistor 47. This equalization is effected due to the following reason.

If equalization is not effected, the data of a readout cycle preceding the current readout cycle will remain on data output line DO3. This means that the output speed of data of the current readout cycle differs depending upon the contents of data (H or L) of the previous readout cycle. To eliminate this problem, equalization is carried out after each readout cycle to pull up the potentials of data output line DO3 and the drain of PMOS transistor 47 to the level in the vicinity of power supply potential Vcc. Equalization by NMOS transistor 61 is carried out to eliminate likewise problems.

By carrying out equalization after each readout cycle, the possibility of effect of the data of the previous readout cycle on the output of data of the current readout cycle is eliminated. More specifically, the equalization cancels the effect of the data of the previous readout cycle to set the speed of the data output of the current readout cycle constant.

Equalize circuit 69 initiates equalization when control signal S4 of an H level and control signal S2 of an L level are input. The reason why equalization is carried out by equalize circuit 69 is set forth in the following.

There are cases when the parasitic capacitance of data output lines DO3 and /DO3 and the gate capacitance of the transistors connected to data output lines DO3 and /DO3 vary caused by the fabrication processes carried out for SSRAMs. More specifically, there is difference in the parasitic capacitance of interconnection and gate capacitance of a transistor from product to product of SSRAMs under the same design. This means that there may be difference in the output of a double current mirror type differential amplifier for every SSRAM of the same design. In order to eliminate this problem, the potentials of data output lines DO3 and /DO3 are equalized to constantly return to a neutral state after each readout cycle by equalize circuit 69.

The provision of equalize circuit 67 prevents variation in the output of a double current mirror type differential amplifier included in each SSRAM product even when the parasitic capacitance of interconnection or gate capacitance of a transistor in each product differs according to the fabrication process.

Figure 5:
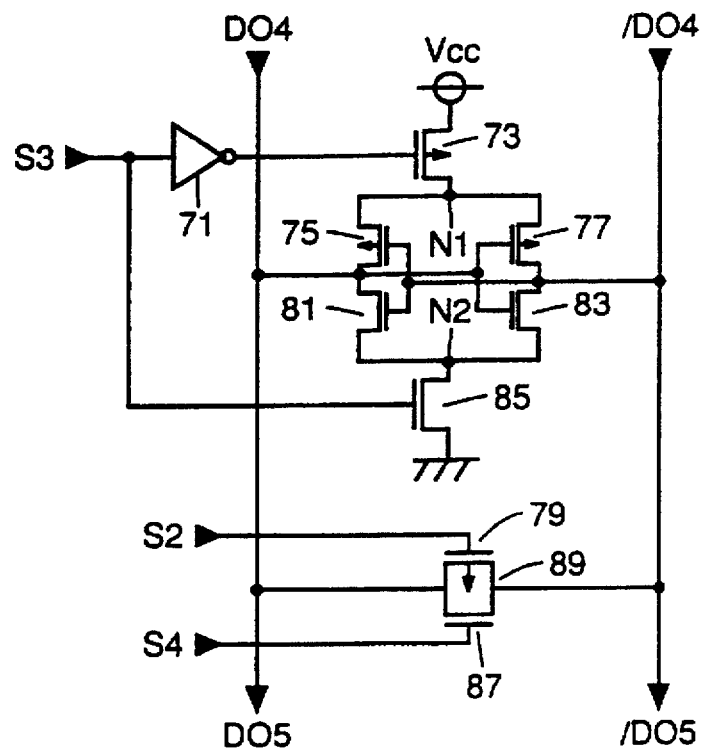
FIG. 5 is a circuit diagram showing in detail a latch type amplifier of FIG. 2.

FIG. 5 is a circuit diagram showing latch type amplifier 15 of FIG. 2. Components corresponding to those of FIG. 2 have the same reference characters denoted, and their description will not otherwise be repeated.

Referring to FIG. 5, latch type amplifier 15 includes PMOS transistors 73, 75, and 77, NMOS transistors 81, 83 and 85, an equalize circuit 89, and an inverter 71.

PMOS transistor 73 is connected between a node including a power supply potential Vcc and a node N1. The gate of PMOS transistor 73 receives control signal S3 inverted by inverter 71. PMOS transistor 75 and NMOS transistor 81, and PMOS transistor 77 and NMOS transistor 83 are connected in series between nodes N1 and N2.

The gate of PMOS transistor 75, the gate of NMOS transistor 81, and the drain of PMOS transistor 77 are connected to data output lines /DO4 and /DO5. The gate of PMOS transistor 77, the gate of NMOS transistor 83, and the drain of PMOS transistor 75 are connected to data output lines DO4 and DO5.

NMOS transistor 85 is connected between a node N2 and a node including ground potential. Control signal S3 is applied to the gate of NMOS transistor 85. PMOS transistor 79 and NMOS transistor 87 have one source/drain connected to data output line DO5 and the other source/drain connected to data output line /DO5. Control signal S2 is applied to the gate of PMOS transistor 79. Control signal S4 is applied to the gate of NMOS transistor 87.

Latch type amplifier 15 initiates an amplify operation (sense) when transfer gates 11 and 13 of FIG. 2 are closed and control signal S3 of an H level is applied. The potentials of data output lines DO4 and /DO4 attain a level in the vicinity of the intermediate potential of power supply potential Vcc right after an operation is initiated. Therefore, PMOS transistor 75 and NMOS transistor 81, and PMOS transistor 77 and NMOS transistor 83 are turned on instantly and simultaneously, whereby current flows between the node including power supply potential Vcc and the node including ground potential.

When the potential difference of data output line pair DO5 and /DO5 is amplified to a full swing (potentials of data output lines DO5 and /DO5 attain power supply potential Vcc level and ground potential GND level, respectively, or ground potential GND level and power supply potential Vcc level, respectively), either PMOS transistor 75 or NMOS transistor 81 is turned off and either PMOS transistor 77 or NMOS transistor 83 is turned off. As a result, current does not flow between the node including power supply potential Vcc and the node including ground potential GND.

Equalize circuit 89 equalizes the potentials of data output lines DO5 and /DO5 when control signal S2 of an L level and control signal S4 of an H level are input. Equalize circuit 89 serves to prevent data of a previous readout cycle from remaining on data output lines DO5 an /DO5 to eliminate effect of data of the previous readout cycle on data output of the current readout cycle. By providing this equalize circuit 89 and carrying out equalization after each readout cycle, proper data can be output reliably.

Figure 6:
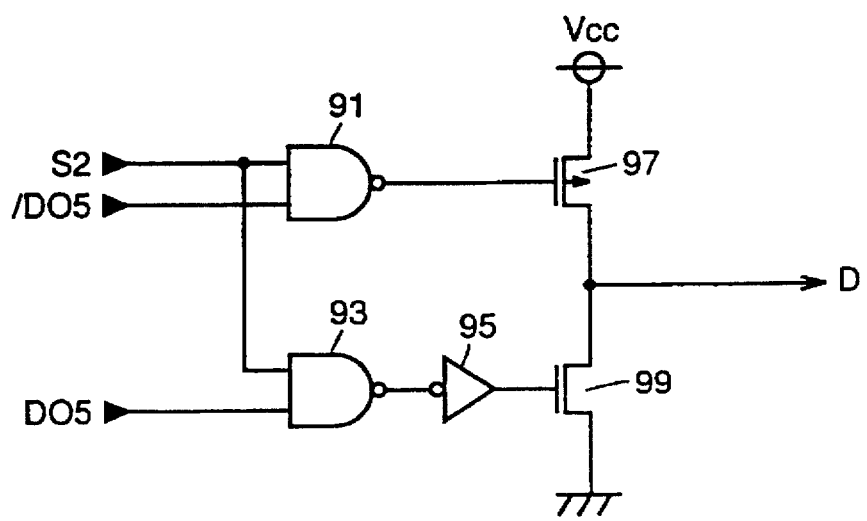
FIG. 6 is a circuit diagram showing in detail a read data buffer of FIG. 2.

FIG. 6 is a circuit diagram showing in detail read data buffer 3 of FIG. 2. Components corresponding to those of FIG. 2 have the same reference characters allotted, and their description will not otherwise be repeated.

Referring to FIG. 6, read data buffer 3 includes NAND circuits 91 and 93, an inverter 95, a PMOS transistor 97 and an NMOS transistor 99.

Control signal S2 is applied to one input node of NAND circuit 91. The other input node of NAND circuit 91 is connected to data output line /DO5. Control signal S2 is applied to one input node of NAND circuit 93. The other input node of NAND circuit 93 is connected to data output line DO5. The output node of NAND circuit 93 is connected to the input node of inverter 95.

PMOS transistor 97 and NMOS transistor 99 are connected in series between the node including power supply potential Vcc and the node including ground potential. PMOS transistor 97 has its gate connected to the output node of NAND circuit 91. NMOS transistor 99 has its gate connected to the output node of inverter 95. The drain of PMOS transistor 97 serves as the output node.

Read data buffer 3 attains an activation state and an inactivation state when control signal S2 of an H level and an L level, respectively, is input. The through current between the node including a power supply potential Vcc and the node including the ground potential is lowered by inactivating read data buffer 3 when not required by control signal S2, i.e. by turning off PMOS transistor 97.

When control signal S2 of an H level is input, data D according to the potential of data output lines DO5 and /DO5 is provided to a data bus.

Figure 7:
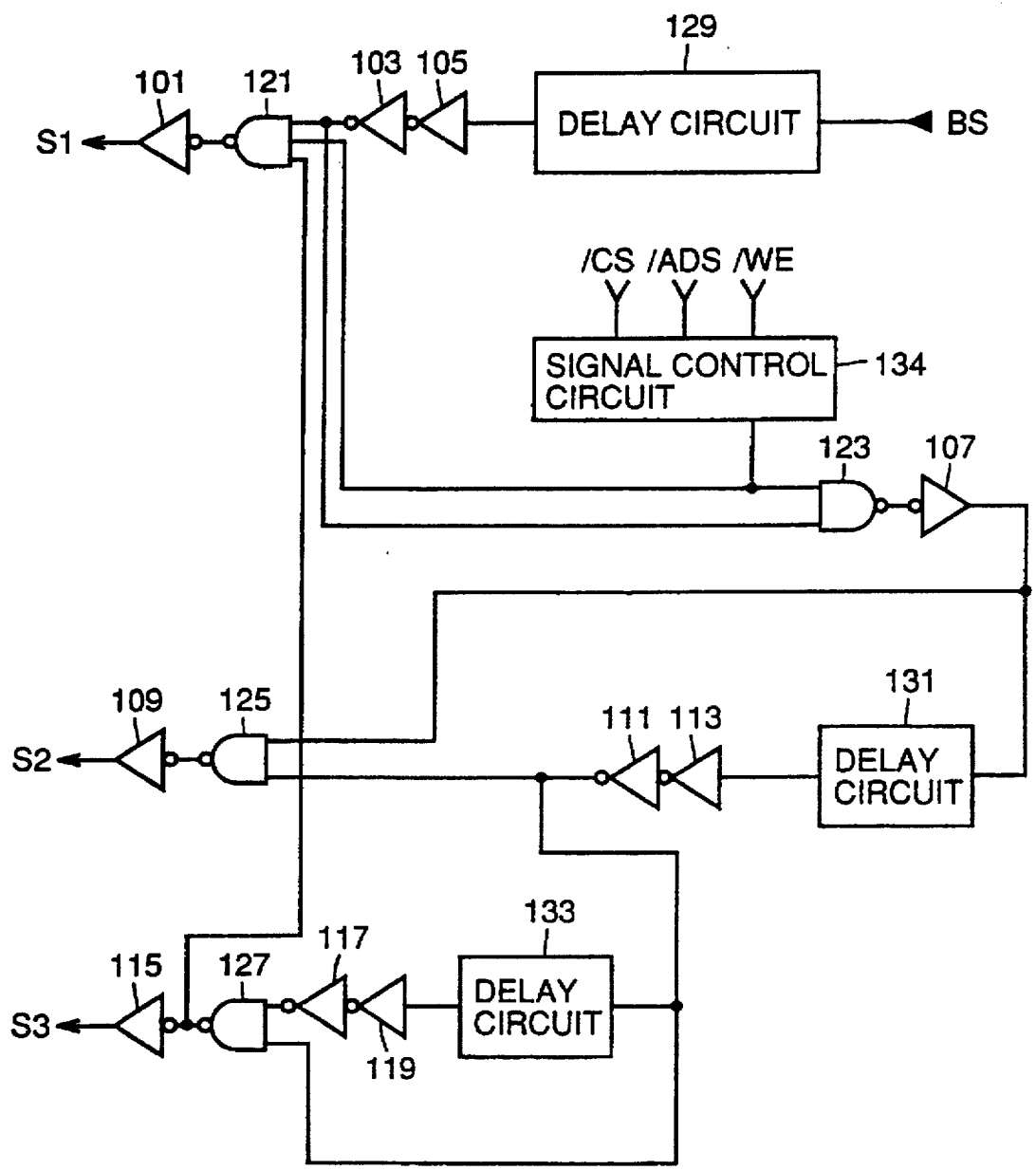
FIG. 7 is a circuit diagram showing in detail a control signal generation circuit of FIG. 2.

FIG. 7 is a circuit diagram showing in detail control signal generation circuit 5 of FIG. 2. Components corresponding to those of FIG. 2 have the same reference characters allotted, and their description will not otherwise be repeated.

Referring to FIG. 7, control signal generation circuit 5 includes inverters 101, 103, 105, 107, 109, 111, 113, 115, 117, 119, NAND circuits 121, 123, 125, and 127, delay circuits 129, 131, 133, and a signal control circuit 134.

Figure 8:
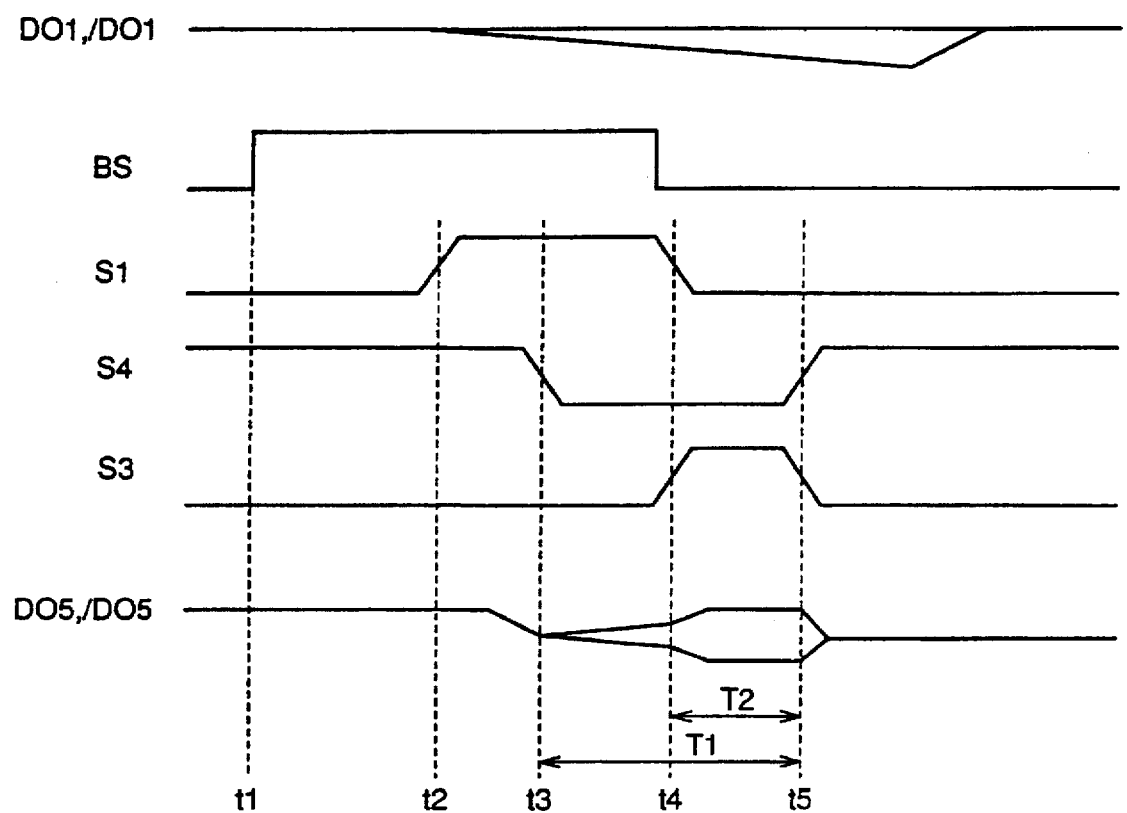
FIG. 8 is a timing chart for explaining the operation of the characteristic portion of an SSRAM according to an embodiment of the present invention.

The operation of control signal generation circuit 5 of FIG. 7 will be described with reference to the timing chart of FIG. 8.

At time t1, block select signal BS of an H level is applied to delay circuit 129. Block signal BS of an H level delayed by delay circuit 129 is applied to NAND circuit 121 via inverters 103 and 105. Signals of H level are applied to the other two input nodes of NAND circuit 121. Therefore, the output signal from NAND gate 121 attains an L level.

In response, control signal S1 attains an H level. Control signal S1 attains an H level at time T2 behind block select signal BS due to the delay of delay circuit 129. Delay circuit 129 has the delay time set so that control signal S1 attains an H level following activation of a word line not shown in response to block select signal BS of an H level.

Signal control circuit 134 provides a signal of an H level and an L level in a readout operation and a writing operation, respectively, according to the chip select signal /CS, write enable signal /WE, and address status input signal /ADS.

Block select signal BS of an H level delayed by delay circuit 129 is applied via inverters 103 and 105 to one input node of NAND circuit 123. A signal of an H level from signal control circuit 134 is applied to the other input node of NAND circuit 123. Therefore, a signal of an H level is applied to one input node of NAND circuit 125. A signal of an H level from inverter 107 is delayed by delay circuit 131 to be applied to the other input node of NAND circuit 125 via inverters 111 and 113.

Therefore, NAND circuit 125 provides a signal of an L level at an elapse of the delay time of delay circuits 129 and 131. At time t3, control signal S2 is pulled up to an H level. Control signal S4 which is an inverted version of control signal S2 is pulled down to an L level at time t3.

Delay circuit 131 has its delay time set so that control signal S2 attains an H level (control signal S4 attains an L level) when the potentials of data output lines DO2 and /DO2 attain the potential level approximately intermediate of power supply potential Vcc. More specifically, the delay time of delay circuit 131 is set so that a sense operation is initiated after the potentials of data output lines DO2 and /DO2 attain the intermediate potential approximately.

A signal of an H level which is a delayed version of block select signal BS of an H level by delay circuits 129 and 131 is applied to one input node of NAND circuit 127. A signal of an H level which is a delayed version of block select signal BS of an H level by delay circuits 129, 131 and 133 is applied to the other input node of NAND circuit 127.

Therefore, the output signal of NAND circuit 127 attains an L level after being delayed by delay circuits 129, 131 and 133, i.e. at time t4. Here, control signal S3 attains an H level. Delay circuit 133 has the delay time set so that control signal S3 attains an H level after the potential difference of data output lines DO4 and /DO4 becomes greater than the offset voltage of latch type sense amplifier 15.

At time t4, the output signal of NAND circuit 127 attains an L level. Therefore, the output signal of NAND circuit 121 is driven to an H level. In response, control circuit S1 is pulled down to an L level at time t4.

The operation of sense amplifier 1 of FIG. 2 will be described hereinafter with reference to FIGS. 2, 3, 4, 5 and 8.

When control signal S1 attains an H level, level shift circuit 7 initiates its operation to shift the potential of data output lines DO1 and /DO1 to a potential level approximately intermediate the power supply potential Vcc. Also, transfer gates 11 and 13 are open since control signal S1 attains an H level. Therefore, the potentials of data output lines DO2, /DO2–DO5, /DO5 substantially attain the intermediate potential at time t3.

Here, the potential of data output line DO2 and the potential of data output line /DO2 are equalized since control signal S2 of an L level and control signal S4 of an H level are applied to equalize circuit 43 of level shift circuit 7. Therefore, there is almost no potential difference between data output lines DO2 and /DO2.

When control signal S4 attains an L level at time t3, sense amplifier 1 initiates a sense operation. Since control signal S4 of an L level and control signal S2 of an H level are applied to equalize circuit 43 of level shift circuit 7, the equalize operation by equalize circuit 43 ends. Therefore, a potential difference according to data read out from a memory cell not shown is generated between data output lines DO2 and /DO2.

Since a potential difference is generated between the pair of data output lines DO2 and /DO2 and control signal S1 of an H level is applied to the gate of NMOS transistor 65 of double current mirror type differential amplifier 9, double current mirror type differential amplifier 9 initiates amplification at time t3.

When the potential difference of the pair of data output lines DO3 and /DO3, the potential difference of the pair of data output lines DO4 and /DO4, and the potential difference of the pair of data output line DO5 and /DO5 become greater than the offset voltage of latch type amplifier 15 by double current mirror type differential amplifier 9, i.e. at time t4, control signal S3 is driven to an H level. Therefore, control signal S3 of an H level is applied to the gate of NMOS transistor 85 of latch type amplifier 15, and a signal of an L level which is an inverted version of control signal S3 of an H level is applied to the gate of PMOS transistor 73.

Thus, latch type amplifier 15 initiates amplification at time t4. Since control signal S4 attains an L level and control signal S2 attains an H level at time t4, equalize circuit 89 of latch type amplifier 15 does not carry out equalization.

A time t4, control signal S1 attains an L level. Therefore, control signal S1 of an L level will be applied to the gates of NMOS transistor 39 of level shift circuit 7 and NMOS transistor 65 of double current mirror type differential amplifier 9. More specifically, level shift circuit 7 and double current mirror type differential amplifier 9 ceases its operation at time t4.

When control signal S3 attains an L level at time t5, latch type amplifier 15 ceases its amplify operation.

In response to control signal S3 attaining an L level at time t5, control signal S2 is driven to an L level and control signal S4 is driven to an H level. Therefore, equalize circuit 43 of level shift circuit 7, equalize circuit 69 of double current mirror type differential amplifier 9, and equalize circuit 89 of latch type amplifier 15 initiate equalization. Furthermore, in response to control signal S4 attaining an H level at time t5, NMOS transistors 57 and 61 of double current mirror type differential amplifier 9 is turned on.

The operation of read data buffer 3 of FIG. 2 will be described hereinafter with reference to FIGS. 2, 6 and 8. When control signal S2 attains an H level at time t3, read data buffer 3 initiates its operation to begin providing data D. Read data buffer 3 ceases its operation to result in the stop of the output of data D when control signal S2 attains an L level at time t5.

Figure 9:
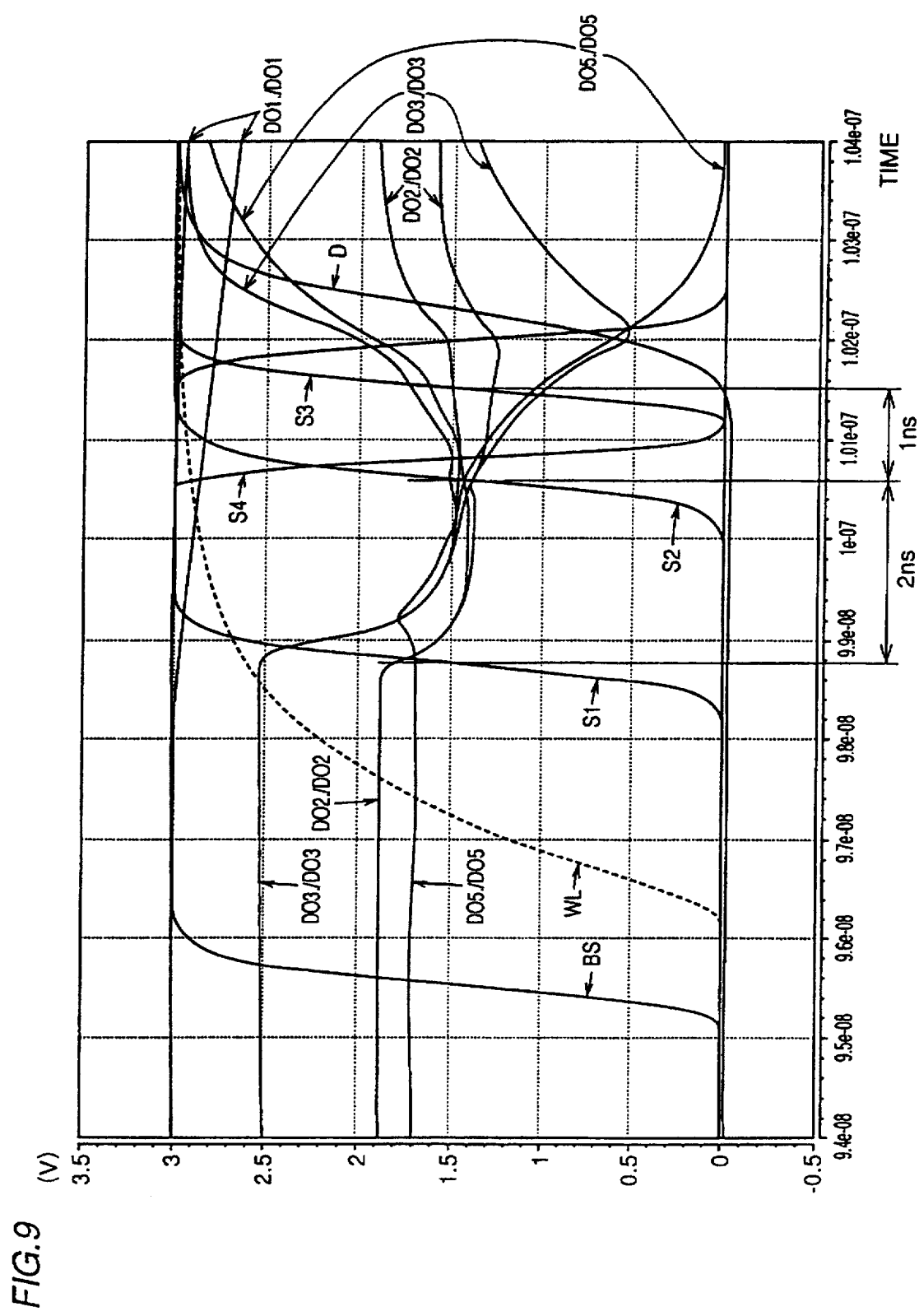
FIG. 9 shows results of operation simulation of an SSRAM according to an embodiment of the present invention.

The graph of FIG. 9 showing the result of operation simulation of the SSRAM of the present embodiment has voltage plotted along the ordinate and time plotted along the abscissa.

Arrow BS designates the amplitude of block select signal BS. Arrows S1, S2, S3, and S4 show the amplitude of control signals S1, S2, S3, and S4, respectively. Arrows DO1 and /DO1 designate the potentials of the pair of data output lines DO1 and /DO1. Arrows DO2 and /DO2 designate the potentials of the pair of data output lines DO2 and /DO2. Arrows DO3 and /DO3 designate the potentials of the pair of data output lines DO3 and /DO3. Arrows DO5 and /DO5 designate the potentials of the pair of data output lines DO5 and /DO5. Arrow D designates data D provided to a data bus.

The time period from a rise of control signal S1 to a rise of control signal S2 is 2 ns, and the time period from the rise of control signal S2 to the rise of control signal S3 is 1 ns, which indicates normal operation. It is to be noted that control signal S3 is pulled up when the potential difference of data output lines DO5 and /DO5 becomes 300 mV taking into consideration the offset voltage of latch type amplifier 15.

According to the SSRAM of the invention of the present application, double current mirror type differential amplifier 9 initiates an amplify operation after the potentials of data output lines DO2 and /DO2 substantially attaining a potential level approximately intermediate power supply potential Vcc by level shift circuit 7, i.e. at time t3. Latch type amplifier 15 initiates an amplify operation and double current mirror type differential amplifier 9 ceases its operation simultaneously when the potential difference of data input/output lines DO4 and /DO4, data output lines DO5 and /DO5 exceeds the offset voltage of latch type amplifier 15 by double current mirror type differential amplifier 9, i.e. at time t4.

Therefore, the potential difference is amplified speedily only by double current mirror type differential amplifier 9 during time t3 to t4. During time t4 to time t5 (time period T2), the potential difference amplified by double current mirror type differential amplifier 9 is further amplified by only latch type amplifier 15 of low power consumption. More specifically, a sense operation is carried out only during time period T1.

The SSRAM according to the embodiment of the present invention has the disadvantage of latch type amplifier 15 (high speed operation not allowed due to the time required for the input potential difference to become greater than the offset voltage of latch type amplifier) is compensated for by the advantage of double current mirror type differential amplifier 9 (high speed operation allowed). Furthermore, the disadvantage of double current mirror type differential amplifier 9 (great power consumption) is compensated for by the advantage of latch type amplifier 15 (low power consumption). Thus, the advantage of double current mirror type differential amplifier 9 (high speed operation) and the advantage of latch type amplifier 15 (low power consumption) can be applied effectively. Thus, speed can be increased and power consumption reduced for an SSRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a memory cell array having a plurality of memory cells, comprising:
   a sense amplifier for amplifying data read out from said memory cell,
   wherein said sense amplifier comprises
   level shift means for shifting levels of potentials of a first pair of data output lines to which said data is read out from said memory cell to lower potential levels, and
   a first amplifier for amplifying potential difference of a second pair of data output lines to which said level-shifted potentials are applied for a predetermined time period, said potential difference being based on data of said memory cell, and
   a second amplifier for further amplifying potential difference amplified by said first amplifier,
   wherein said first amplifier operates more speedily than said second amplifier,
   and wherein said second amplifier is a cross coupled amplifier
   said first amplifier carries out an amplifying operation for said predetermined time period after said level shifting,
   and wherein only said second amplifier carries out an amplifying operation after said predetermined time period has elapsed,
   and at least one of said first and second sense amplifiers is controlled by an externally produced clock signal.

2. The semiconductor memory device according to claim 1, wherein said first amplifier includes two current mirror amplifiers.

3. The semiconductor memory device according to claim 2, wherein said current mirror amplifier comprises current mirror means, wherein said current mirror means comprises
- a first transistor having one electrode connected to an output node of said current mirror amplifier, and
- a second transistor having one electrode and a control electrode connected to a control electrode of said first transistor, wherein said current mirror amplifier further comprises equalize means for equalizing a potential of said output node and a potential of a node to which said one electrode of said second transistor is connected, wherein said equalization is carried out after amplification of said potential difference by said second amplifier.

4. The semiconductor memory device according to claim 2, wherein said first amplifier further comprises equalize means for equalizing a potential of an output node of one of said current mirror amplifiers and a potential of an output node of the other of said current mirror amplifiers, wherein said equalization is carried out after amplification of said potential difference by said second amplifier.

5. The semiconductor memory device according to claim 2, wherein said sense amplifier comprises first connection means for connecting an output node of one of said current mirror amplifiers and one input node of said second amplifier, and second connection means for connecting an output node of the other of said current mirror amplifiers and the other input node of said second amplifier, wherein said first connection means cuts off connection between said output node of said one current mirror amplifier and said one input node at an elapse of said predetermined time period, and wherein said second connection means cuts off connection between said output node of said other current mirror amplifier and said other input node at an elapse of said predetermined time period.

6. The semiconductor memory device according to claim 2, wherein said second amplifier comprises two output nodes, and equalize means for equalizing potential of one of said output nodes and potential of the other of said output nodes, wherein said equalization is carried out after amplification of said potential difference by said second amplifier.

7. A semiconductor memory device including a memory cell array having a plurality of memory cells, comprising:

a sense amplifier for amplifying data read out from said memory cell, wherein said sense amplifier comprises level shift means for shifting levels of potentials of a first pair of data output lines to which said data is read out from said memory cell to lower potential levels, and a first amplifier for amplifying potential difference of a second pair of data output lines to which said level-shifted potentials are applied for a predetermined time period, said potential difference being based on data of said memory cell, and a second amplifier for further amplifying potential difference amplified by said first amplifier, wherein said first amplifier operates more speedily than said second amplifier, said second amplifier is a cross coupled amplifier, said first amplifier carries out an amplifying operation for said predetermined time period after said level shifting, only said second amplifier carries out an amplifying operation after said predetermined time period has elapsed, and said memory cell array is divided into a plurality of blocks, said semiconductor memory device further comprising operation control means for controlling operation of said level shift means, said first amplifier and said second amplifier, wherein said operation control means controls said operation using a control signal based on a block select signal that determines which of said plurality of blocks is to be activated, wherein said block select signal is generated in synchronization with an external clock signal.

8. The semiconductor memory device according to claim 5, wherein said first amplifier carries out an amplify operation for said predetermined time period after said level shifting, and wherein only said second amplifier carries out an amplify operation at an elapse of said predetermined time period.

9. A semiconductor memory device including a memory cell array having a plurality of memory cells, comprising:

a sense amplifier for amplifying data read out from said memory cell, wherein said sense amplifier comprises level shift means for shifting levels of potentials of a first pair of data output lines to which said data is read out from said memory cell to lower potential levels, and a first amplifier for amplifying potential difference of a second pair of data output lines to which said level-shifted potentials are applied for a predetermined time period, said potential difference being based on data of said memory cell, and a second amplifier for further amplifying potential difference amplified by said first amplifier, wherein said first amplifier operates more speedily than said second amplifier, said second amplifier is a cross coupled amplifier, said first amplifier includes two current mirror amplifiers, and wherein said sense amplifier comprises first connection means for connecting an output node of one of said current mirror amplifiers and one input node of said second amplifier, and second connection means for connecting an output node of the other of said current mirror amplifiers and the other input node of said second amplifier, wherein said first connection means cuts off connection between said output node of said one current mirror amplifier and said one input node at an elapse of said predetermined time period, said second connection means cuts off connection between said output node of said other current mirror amplifier and said other input node at an elapse of said predetermined time period, said first amplifier carries out an amplifying operation for said predetermined time period after said level shifting, wherein only said second amplifier carries out an amplifying operation at an elapse of said predetermined time period, wherein said memory cell array is provided into a plurality of blocks, said semiconductor memory device further comprising operation/connection control means for controlling operation of said level shift means, said first amplifier, and said second amplifier, and connection of said first and second connection means, wherein said operation/connection control means controls said operation and connection using a control signal based on a block select signal that determines which of said plurality of blocks is to be activated, wherein said block select signal is generated in synchronization with an external clock signal.

10. A semiconductor memory device including a memory cell array having a plurality of memory cells, comprising:

a sense amplifier for amplifying data read out from said memory cell, wherein said sense amplifier comprises a first amplifier and a second amplifier of lower power consumption and lower speed than the first amplifier, wherein said first amplifier carries out an amplifying operation only for a predetermined time period, and at least one of said first and second amplifiers is controlled by an externally produced clock signal.

11. The semiconductor memory device according to claim 10, wherein the second amplifier is coupled to the output of the first amplifier.

12. The semiconductor memory device according to claim 10, wherein the second amplifier carries out an amplifying operation only after the predetermined period.

13. The semiconductor memory device according to claim 10, wherein said first amplifier carries out an amplifying operation for said predetermined time period after said level shifting, and wherein only said second amplifier carries out an amplifying operation after the predetermined time period.

14. The semiconductor memory device according to claim 1, wherein the cross coupled amplifier is a latch type amplifier.

15. The semiconductor memory device according to claim 7, wherein the cross coupled amplifier is a latch type amplifier.

16. The semiconductor memory device according to claim 9, wherein the cross coupled amplifier is a latch type amplifier.

17. A semiconductor memory device including a memory cell array having a plurality of memory cells, comprising:

a sense amplifier for amplifying data read out from said memory cell, wherein said sense amplifier comprises level shift means for shifting levels of potentials of a first pair of data output lines to which said data is read out from said memory cell to lower potential levels, and a first amplifier for amplifying potential difference of a second pair of data output lines to which said level-shifted potentials are applied for a predetermined time period, said potential difference being based on data of said memory cell, and a second amplifier for further amplifying potential difference amplified by said first amplifier, wherein said first amplifier operates more speedily than said second amplifier, said second amplifier is a cross coupled amplifier, and said sense amplifier comprises first connection means for connecting an output node of one of said current mirror amplifiers and one input node of said second amplifier, and second connection means for connecting an output node of the other of said current mirror amplifiers and the other input node of said second amplifier, wherein said first connection means cuts off connection between said output node of said one current mirror amplifier and said one input node at an elapse of said predetermined time period, said second connection means cuts off connection between said output node of said other current mirror amplifier and said other input node at an elapse of said predetermined time period, and said first and second connection means are controlled by an externally produced clock signal.

* * * * *